United States Patent
Utsugi

(10) Patent No.: US 6,643,794 B1
(45) Date of Patent: Nov. 4, 2003

(54) SEMICONDUCTOR STORAGE UNIT

(75) Inventor: Satoshi Utsugi, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/444,595

(22) Filed: Nov. 22, 1999

(30) Foreign Application Priority Data

Nov. 26, 1998 (JP) .......................................... 10-336360

(51) Int. Cl.[7] .............................................. G06F 11/00
(52) U.S. Cl. .......................................... 714/6; 365/201
(58) Field of Search .......................... 714/6, 7, 13, 25, 714/42, 721, 733, 8, 30; 365/201, 200; 711/133, 134

(56) References Cited

U.S. PATENT DOCUMENTS

| | | | | |
|---|---|---|---|---|
| 4,935,899 A | * | 6/1990 | Morigami | 365/200 |
| 5,060,197 A | * | 10/1991 | Park et al. | 365/200 |
| 5,289,417 A | * | 2/1994 | Ooishi et al. | 365/200 |
| 5,386,386 A | * | 1/1995 | Ogihara | 365/200 |
| 5,469,388 A | * | 11/1995 | Park | 365/200 |
| 5,504,713 A | * | 4/1996 | Ooishi et al. | 365/200 |
| 5,548,555 A | * | 8/1996 | Lee et al. | 365/200 |
| 5,970,002 A | * | 10/1999 | Yoo | 365/200 |
| 6,003,148 A | * | 12/1999 | Yamauchi et al. | 714/711 |

FOREIGN PATENT DOCUMENTS

| | | | |
|---|---|---|---|
| JP | 528794 | 2/1993 | ........... G11C/29/00 |
| JP | 5-28794 | 2/1993 | ........... G11C/29/00 |
| JP | 877791 | 3/1996 | ........... G11C/29/00 |
| JP | 8-77791 | 3/1996 | ........... G11C/29/00 |

* cited by examiner

Primary Examiner—Nadeem Iqbal
(74) Attorney, Agent, or Firm—Hayes Soloway P.C.

(57) ABSTRACT

A semiconductor storage unit is provided with a memory cell array that is sectioned into a plurality of blocks, a redundant memory cell, and a redundant memory cell selection circuit for replacing a defective cell in the memory cell array with the redundant memory cell. The redundant memory cell selection circuit is provided with n-channel MOS transistors (N00–N03) to whose gates a block selection signal (BLK) is input, p-channel MOS transistors (P0–P3) to whose gates a block selection signal (BLKB) that is reverse in logical value to the block selection signal (BLK) is input, and fuses (F0–F3) that are connected between the sources or drains of the transistors (N00–N03) and those of the transistors (P0–P3), respectively. Thereby, it is possible to reduce the number of fuses and the size of a chip.

6 Claims, 2 Drawing Sheets

A0, A1, A2, A3 ; COLUMN COMPLEMENTARY ADDRESS SIGNAL

BLKB ; BLOCK SELECTION SIGNAL

RSEL ; REDUNDANT COLUMN SELECTION SIGNAL

YALL ; ENABLE SIGNAL

SEMICONDUCTOR STORAGE UNIT

BACKGROUND OF THE INVENTION

1. Field of the Invention

The present invention relates to a semiconductor storage unit having redundant memory cells. In particular, the invention relates to a semiconductor storage unit capable of reducing the size of a chip thereof.

2. Description of the Prior Art

In general, a redundant memory cell selection decoder having fuses is used in semiconductor storage units having redundant memory cells. In such semiconductor storage units, the number of necessary fuses in the redundant memory cell selection decoder increases as the memory capacity increases. However, it is more difficult to miniaturize such semiconductor storage units than other circuit elements because the fuses need to be cut by laser light application, for example.

For example, in the redundant memory cell selection decoder that is described as a prior art technique in Japanese Patent Laid-Open No. 5-28794, a block selection signal is used as an input of the redundant memory cell decoder. In this technique, since one complementary fuse is necessary for each address signal, the number of fuses necessary for a 3-bit address is 3×2=6.

In view of the above, a column redundant circuit for a semiconductor memory device has been proposed to reduce the number of fuses (Japanese Patent Laid-Open No. 8-77791). In the conventional column redundant circuit disclosed in this publication, nine fuses including a master fuse are provided for an 8-bit column address.

However, although the conventional column redundant circuit disclosed in Japanese Patent Laid-Open No. 8-77791 can reduce the number of fuses, other circuits are complex in configuration and hence the chip size miniaturization is insufficient.

BRIEF SUMMARY OF THE INVENTION

Object of the Invention

The present invention has been made to solve the above problems in the art, and an object of the invention is therefore to provide a semiconductor storage unit which can reduce the number of fuses and the size of a chip.

SUMMARY OF THE INVENTION

The invention provides a semiconductor storage unit comprising a memory cell array that is sectioned into a plurality of blocks; a redundant memory cell; and a redundant memory cell selection circuit for replacing a defective memory cell in the memory cell array with the redundant memory cell in such a manner that the replacement is correlated with a first block selection signal for selecting a prescribed block from among the plurality of blocks and a second block selection signal that is reverse in logical value to the first block selection signal.

In the invention, the redundant memory cell selection circuit replaces a defective memory cell in the memory cell array with the redundant memory cell in such a manner that the replacement is correlated with the first block selection signal and the second block selection signal that is reverse in logical value to the first block selection signal. Therefore, the number of fuses for determining the address of a defective memory cell can be reduced and the circuit configuration for that purpose can be simplified. As a result, the chip size can be reduced.

The redundant memory cell selection circuit may comprise first field-effect transistors to whose gates the first block selection signal is input; second field-effect transistors to whose gates the second block selection signal is input and that are different in channel conductivity type from the first field-effect transistors; and fuses connected between the sources or drains of the first field-effect transistors and those of the second field-effect transistors, respectively.

Further, the memory cell array may be sectioned into a plurality of column or row blocks.

Further, a plurality of redundant memory cells that configure a redundant memory cell block may be provided as the redundant memory cell.

Further, the first field-effect transistors and the second field-effect transistors may be provided by one per one bit of a memory cell address.

DETAILED DESCRIPTION OF THE PREFERRED EMBODIMENTS

Figure 1:
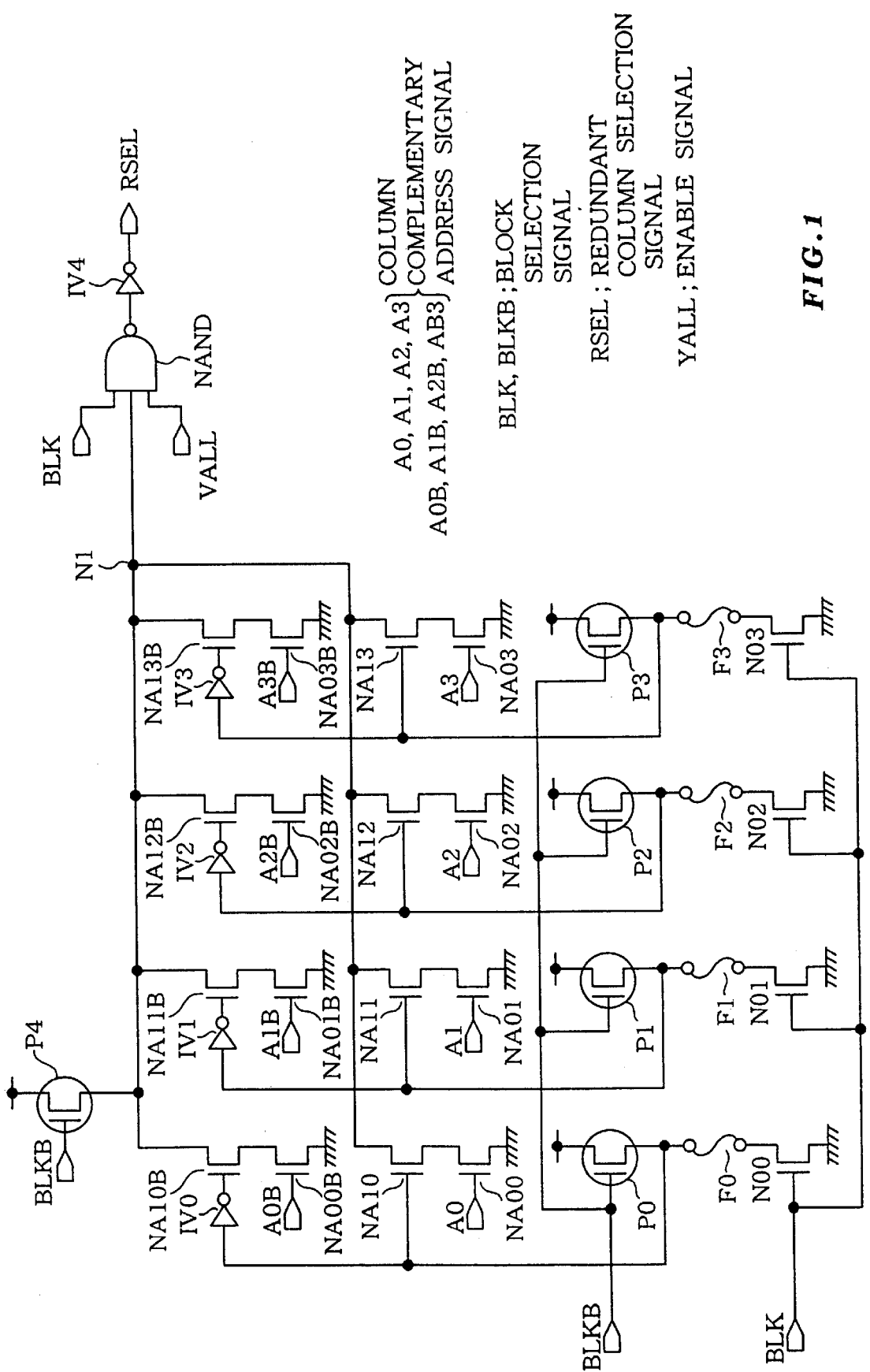
FIG. 1 is a circuit diagram showing a redundant column selection circuit as a redundant memory cell selection circuit in a semiconductor storage unit according to an embodiment of the present invention.

A semiconductor storage unit according to an embodiment of the present invention will be hereinafter described in detail with reference to the accompanying drawings. In this embodiment, a memory cell array is sectioned into a plurality of column blocks and each memory cell in each block is given a 4-bit address. Further, a redundant memory cell block is provided that is composed of a plurality of redundant memory cells for replacement with defective memory cells. FIG. 1 is a circuit diagram showing a redundant column selection circuit as a redundant memory cell selection circuit in the semiconductor storage unit according to the embodiment of the invention.

The semiconductor storage unit according to the embodiment is provided, as a redundant memory cell selection circuit, with a redundant column selection circuit to which column complementary address signals A0–A3 and A0B–A3B are input. This redundant column selection circuit is provided with four n-channel MOS transistors N00–N03 to whose gates a block selection signal BLK is input. The sources of the transistors N00–N03 are grounded and fuses F0–F3 are connected to their respective drains.

The redundant column selection circuit is also provided with four p-channel MOS transistors P0–P3 to whose gates a block selection signal BLKB is input. A power line having a prescribed voltage is connected to the sources of the transistors P0–P3 and the fuses F0–F3 are connected to their respective drains. The block selection signals BLK and BLKB are in a complementary relationship: the block selection signal BLKB is low when the block selection signal BLK is high, and vice versa. The current capacity of the transistors P0–P3 is set lower than that of the transistors N00–N03 by making the channel length longer or making the channel width narrower. Therefore, under a condition that a feed-through current flows, the drains of the transistors P0–P3 are at a low level.

The redundant column selection circuit is also provided with an n-channel MOS transistor NA00 to whose gate the column complementary address signal A0 is input. The source of the transistor NA00 is grounded. An n-channel MOS transistor NA10 is provided to whose gate a voltage at the connecting point of the drain of the transistor P0 and the fuse F0 is input. The drain of the transistor NA00 and the source of the transistor NA10 are connected to each other. Further, n-channel MOS transistors NA01–NA03 and NA11–NA13 are provided in similar manners. The drains of the transistors NA10–NA13 are commonly connected to a node N1.

The redundant column, selection circuit is also provided with an n-channel MOS transistor NA00B to whose gate the column complementary address signal A0B is input. The source of the transistor NA00B is grounded. An inverter IV0 is provided to which the voltage at the connecting point of the drain of the transistor P0 and the fuse F0 is input. An n-channel MOS transistor NA10B is provided to whose gate an output of the inverter IV0 is input. The drain of the transistor NA00B and the source of the transistor NA10B are connected to each other. Further, n-channel MOS transistors NA01B–NA03B and NA11B–NA13B and inverters IV1–IV3 are provided in similar manners. The drains of the transistors NA10B–NA13B are commonly connected to the node N1.

The redundant column selection circuit is also provided with a p-channel MOS transistor P4 to whose gate the block selection signal BLKB is input. The source of the transistor P4 is connected to a power line having a prescribed voltage and its drain is connected to the node N1. As in the transistors P0–P4, the current capacity of the transistor P4 is set low. Therefore, under a condition that a feed-through current flows through the transistor P4, its drain is at a low level.

The redundant column selection circuit is also provided with a NAND circuit NAND to which a voltage of the node N1, an enable signal YALL, and the block selection signal BLK are input. An inverter IV4 is provided to which an output of the NAND circuit NAND is input. A redundant column selection signal RSEL is output from the inverter IV4.

Figure 2:
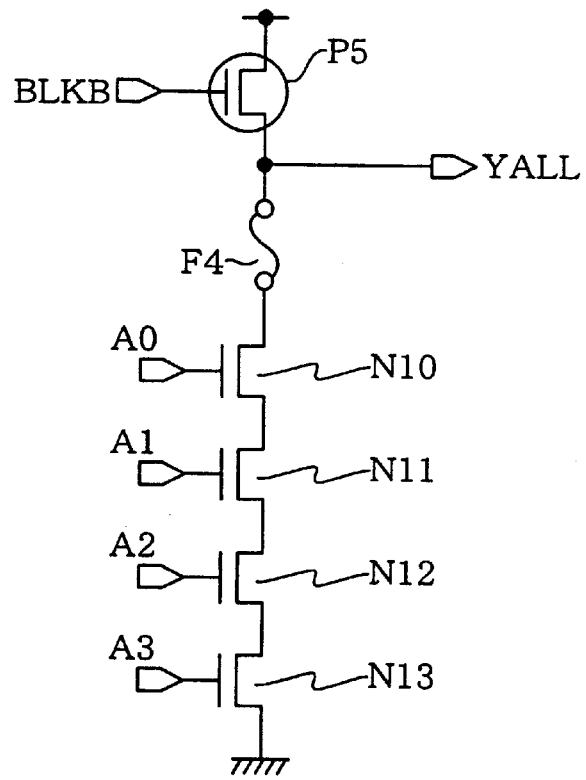
FIG. 2 is a circuit diagram showing an output circuit of an enable signal YALL.

The enable signal YALL is a signal that determines whether to replace a memory cell having an address "1111." FIG. 2 is a circuit diagram showing an output circuit of the enable signal YALL.

The output circuit of the enable signal YALL is provided with a p-channel MOS transistor P5 to whose gate the block selection signal BLKB is input. The source of the transistor P5 is connected to a power line having a prescribed voltage and its drain is connected to a fuse F4. There are provided n-channel MOS transistors N10–N13 to whose gates the column complementary address signals A0–A3 are input, respectively, and that are connected to each other to form multiple stages. The source of the transistor N13 is grounded and the drain of the transistor N10 is connected to the fuse F4. The enable signal YALL is output from the connecting point of the drain of the transistor P5 and the fuse F4. The current capacity of the transistor P5 is set low. Therefore, when all of the transistors P5 and N10–N13 are turned on in a state that the fuse F4 is on, the level of the enable signal YALL becomes low.

In the above-configured output circuit, the fuse F4 is cut (turned off) when replacement of a memory cell having an address "1111" is to be made effective. As a result, the enable signal YALL is always kept high during block selection (the block selection signal BLK is high and the block selection signal BLKB is low). On the other hand, the fuse F4 is kept on when replacement of the memory cell having the address "1111" is not performed. As a result, the level of the enable signal YALL becomes low when the address "1111" is input.

Next, the operation of the above-configured redundant column selection circuit of the semiconductor storage unit according to the embodiment will be described. The following description is directed to an example in which a memory cell having an address (A0–3) "0011" is to be replaced.

To replace the memory cell having the address "0011," the fuses F0–F3 are made off, off, on, and on, respectively. As a result, if the address "0011" is input during block selection, that is, when the block selection signal BLK is high and the block selection signal BLKB is low, the level of the node N1 becomes high. If the enable signal YALL is high at this time point, the redundant column selection signal RSEL becomes high and the memory cell having the address "0011" is replaced.

To replace a memory cell having any of the other addresses, a fuse(s) corresponding to a bit "0" of the address is turned off and the other fuses are kept on in the same manner as in the above example except that the memory cell having the address "1111" is to be replaced. The memory cell having the address "1111" can be replaced only by turning off the fuse F4 in the output circuit.

As described above, according to this embodiment, memory cell replacement for a 4-bit address can be performed by using five fuses. Therefore, in a case where redundant columns are provided at a rate of four columns per block, the number of necessary fuses is 4×4+1=17. In contrast, in the case of the conventional complementary fuse scheme, the number of necessary fuses is 4×4×4=32. Therefore, the embodiment approximately halves the number of fuses. With an additional advantage that the circuit configuration is simple, the embodiment makes it possible to easily reduce the chip size.

The invention is not limited to the redundant column selection circuit in semiconductor storage units. A configuration similar to the above may be employed in a redundant row selection circuit. In this case, a memory cell array is sectioned into a plurality of row blocks.

As described above in detail, according to the invention, the redundant memory cell selection circuit is provided that replaces a defective memory cell in the memory cell array with a redundant memory cell in such a manner that the replacement is correlated with a first block selection signal and a second block selection signal that is reverse in logical value to the first block selection signal. Therefore, the number of fuses for determining the address of a defective memory cell can be reduced and the circuit configuration for that purpose can be simplified. As a result, the chip size can be reduced.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-336360 (Filed on Nov. 26$^{th}$, 1998) including specification, claims, drawings and summary are incorporated herein by reference in its entirety.

What is claimed is:

1. A semiconductor storage unit comprising:
   a memory cell array that is sectioned into a plurality of blocks;
   a redundant memory cell; and
   a redundant memory cell selection circuit for replacing a defective memory cell in the memory cell array with the redundant memory cell in such a manner that the replacement is correlated with a first block selection signal for selecting a prescribed block from among the plurality of blocks and a second block selection signal that is reverse in logical value to the first block selection signal, wherein the redundant memory cell selection circuit comprises:

first field-effect transistors to whose gates the first block selection signal is input;

second field-effect transistors to whose gates the second block selection signal is input and that are different in channel conductivity type from the first field-effect transistors; and fuses connected between the sources or drains of the first field-effect transistors and those of the second field-effect transistors.

2. The semiconductor storage unit according to claim 1, wherein the memory cell array is sectioned into a plurality of column blocks.

3. The semiconductor storage unit according to claim 1, wherein the memory cell array is sectioned into a plurality of row blocks.

4. The semiconductor storage unit according to claim 1, wherein the semiconductor storage circuit comprises a plurality of redundant memory cells that configure a redundant memory cell block.

5. The semiconductor storage unit according to claim 2, wherein the semiconductor storage circuit comprises a plurality of redundant memory cells that configure a redundant memory cell block.

6. The semiconductor storage unit according to claim 1, wherein the first field-effect transistors and the second field-effect transistors are provided by one per one bit of a memory cell address.

* * * * *